(12) United States Patent
Wei et al.

(10) Patent No.: US 12,090,503 B2
(45) Date of Patent: *Sep. 17, 2024

(54) SEMICONDUCTOR PROCESS CHAMBER CONTAMINATION PREVENTION SYSTEM

(71) Applicant: Taiwan Semiconductor Manufacturing Co., Ltd., Hsinchu (TW)

(72) Inventors: Kai-Chin Wei, Hsinchu (TW); Che-fu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/362,760

(22) Filed: Jul. 31, 2023

(65) Prior Publication Data
US 2023/0372960 A1 Nov. 23, 2023

Related U.S. Application Data

(63) Continuation of application No. 17/037,390, filed on Sep. 29, 2020, now Pat. No. 11,779,949.

(60) Provisional application No. 62/928,074, filed on Oct. 30, 2019.

(51) Int. Cl.
*B05B 15/58* (2018.01)
*B05B 12/08* (2006.01)
*C23C 16/44* (2006.01)

(52) U.S. Cl.
CPC ............. *B05B 15/58* (2018.02); *B05B 12/08* (2013.01); *C23C 16/4408* (2013.01)

(58) Field of Classification Search
CPC ......... B05B 15/58; B05B 12/08; B05B 1/005; C23C 16/4408; C23C 16/4412; H01L 21/67017; H01L 21/6719
See application file for complete search history.

(56) References Cited

U.S. PATENT DOCUMENTS

| | | | |
|---|---|---|---|
| 4,060,041 A | 11/1977 | Sowards | |
| 4,867,079 A * | 9/1989 | Shang | F23C 10/002 431/170 |
| 6,391,146 B1 | 5/2002 | Bhatnagar et al. | |
| 7,309,471 B2 | 12/2007 | Benje et al. | |
| 2002/0182131 A1 | 12/2002 | Kaushal et al. | |
| 2009/0008369 A1 | 1/2009 | Nozawa et al. | |
| 2013/0186340 A1 | 7/2013 | Omori et al. | |
| 2018/0073137 A1 | 3/2018 | Xavier et al. | |

FOREIGN PATENT DOCUMENTS

JP    H09326398 A    12/1997

* cited by examiner

*Primary Examiner* — Patrick C Williams
(74) *Attorney, Agent, or Firm* — Seed IP Law Group LLP

(57) ABSTRACT

A semiconductor process system includes a semiconductor process chamber having an interior volume. A pump extracts gases from the semiconductor process chamber via an outlet channel communicably coupled to the semiconductor process chamber. The system includes a plurality of fluid nozzles configured to prevent the backflow of particles from the outlet channel to interior volume by generating a fluid barrier within the outlet channel responsive to the pump ceasing to function.

20 Claims, 7 Drawing Sheets

SEMICONDUCTOR PROCESS CHAMBER CONTAMINATION PREVENTION SYSTEM

BACKGROUND

Semiconductor wafers are processed in semiconductor processing facilities. Semiconductor wafers undergo a large number of processes including thin-film depositions, photo resist patterning, etching processes, dopant implantation processes, annealing processes, and other types of processes. These processes form the features, layers, and circuit components of the integrated circuits that will eventually result from the semiconductor wafers.

Many of these processes are performed in semiconductor process chambers. The integrated circuits that result from the semiconductor wafers are highly sensitive to any variations in shapes, thin-film thicknesses, and impurities. Accordingly, conditions within the semiconductor process chambers are tightly controlled to ensure that the shapes, layers, and compositions of the various materials fall within selected tolerances. Nevertheless, in some cases, it is possible that faults can arise within the semiconductor process chambers or with equipment associated with the semiconductor processes. In these cases, it is possible that the semiconductor wafers will be adversely affected if specified conditions within the semiconductor process chambers cannot be properly maintained.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
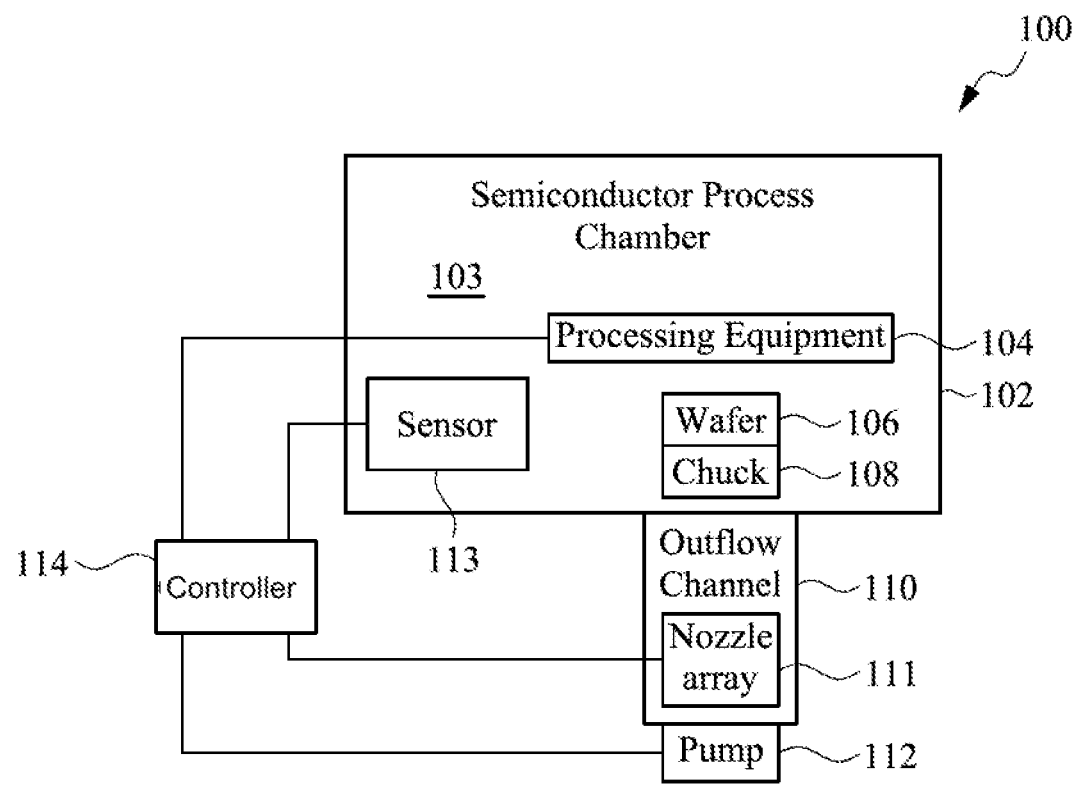
FIG. 1 is a block diagram of a semiconductor process system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram of a semiconductor process system 100, according to one embodiment. The semiconductor process system 100 includes a semiconductor process chamber 102, an outflow channel 110, a pump 112, and a controller 114. The semiconductor process chamber 102 has an interior volume 103. The semiconductor process chamber 102 includes processing equipment 104, a chuck 108, and a sensor 113. The chuck 108 is configured to hold or otherwise support a substrate, such as a semiconductor wafer 106 during semiconductor processing. The processing equipment 104 and the sensor 113 are positioned at least partially within the semiconductor process chamber 102.

In one embodiment, the semiconductor process chamber 102 is configured to perform one or more semiconductor processes on the wafer 106. The wafer 106 is a semiconductor wafer. Typically, semiconductor wafers undergo a large number of processes during fabrication. These processes can include thin-film depositions, photo resist patterning, etching processes, dopant implantation processes, annealing processes, and other types of processes. After all the processing steps are complete, the wafer 106 will be diced into a plurality of individual integrated circuits.

In one embodiment, the semiconductor process chamber 102 is a thin film deposition chamber. The thin-film deposition chamber can include a chemical vapor deposition chamber, a sputtering chamber, a physical vapor deposition chamber, an atomic layer deposition chamber, a plasma enhanced vapor deposition chamber, an epitaxial growth chamber, or other types of thin-film deposition chambers. Those of skill in the art will recognize, in light of the present disclosure, that the semiconductor process chamber 102 can include a thin-film deposition chamber other than those described above without departing from the scope of the present disclosure.

In one embodiment, the semiconductor process chamber 102 is an etching chamber. The etching chamber is utilized to etch thin films deposited on the wafer 106. The etching chamber can include a chamber for wet etching, dry etching, plasma etching, or other types of etching processes. Etching chambers other than those described above can be utilized without departing from the scope of the present disclosure.

In one embodiment, the semiconductor process chamber 102 is a dopant implantation chamber. The dopant implantation chamber can include an ion implantation chamber in which the wafer 106 is bombarded with dopant ions. The dopant ions are implanted within the wafer 106 in accordance with selected parameters for the ion implantation process. The dopant implantation chamber can include dopant implantation process other than those described above without departing from the scope of the present disclosure.

The semiconductor process chamber 102 includes processing equipment 104. The processing equipment 104 assists in performing the semiconductor processes. The processing equipment 104 can include equipment that assists in thin-film deposition processes, etching processes, ion implantation processes, annealing processes, photolithography processes, and other types of processes. Some of the processing equipment 104 may be positioned entirely within the semiconductor process chamber 102. Some of the processing equipment 104 may be positioned partially within the semiconductor process chamber 102 and partially external to the semiconductor process chamber 102. Some of the processing equipment 104 may be positioned entirely external to the semiconductor process chamber 102.

In order to achieve uniform results for large number of wafers 106 in the various semiconductor processes, it is beneficial to maintain the temperature within the semiconductor process chambers in a selected range during processing procedures. If the temperature is not well-controlled within the semiconductor process environment, it is possible that semiconductor wafers will have poor uniformity, have undesirable performance characteristics, or may need to be entirely scrapped. Accordingly, the semiconductor process equipment 104 may include a heater to heat the interior volume 103.

Additionally, various semiconductor processes may call for particular pressure conditions within the semiconductor process chamber 102. For example, some semiconductor processes may call for vacuum conditions within the interior volume 103 in order to achieve a desired result in the wafer 106. Other semiconductor processes may call for high pressures within the interior volume 103 in order to achieve a desired result in the wafer 106. Accordingly, pressure conditions in a semiconductor process chamber 102 during a semiconductor process are selected based on that particular semiconductor process.

Though not shown in FIG. 1, the processing equipment 104 may include various fluid inlets configured to supply fluid to the semiconductor process chamber 102 during semiconductor processing. The processing equipment 104 may supply fluids intended to etch portions of the wafer 106 or to deposit a thin-film on the wafer 106. The processing equipment 104 may supply inert gases for pressurizing the interior volume 103 or for flushing other fluids or articles from the interior chamber 103.

In one embodiment, the outflow channel 110 is configured to pass fluids, particles, or other material from the interior volume 103 to an exterior of the semiconductor process chamber 102. The outflow channel 110 may include one or more mechanisms for selectively opening and closing the outflow channel 110. The selective opening and closing of the outflow channel 110 can be utilized to vent the interior volume 103 or to prevent fluid or particles from leaving the interior volume 103.

In one embodiment, a pump 112 is communicatively coupled to the outflow channel 110. The pump 112 is configured to establish and maintain a vacuum condition within the interior volume 103. For example, if a semiconductor process calls for a vacuum condition within the interior volume 103, then the outflow channel 110 can be opened and the pump 112 can be operated to pump fluid from the interior volume 103 through the outflow channel 110. The pump 112 can also be operated maintain a selected low pressure other than a vacuum within the interior volume 103. As used herein, the term "vacuum" can include conditions in which a total vacuum is not achieved. Accordingly, the term "vacuum" can include extremely low, but non-zero pressures.

In one embodiment, the controller 114 controls the pump 112. The controller 114 may control the pump 112 to generate selected pressure conditions within the interior volume 103 by causing the pump 112 to pump fluid out of the interior volume 103 via the outflow channel 110. For example, the controller 114 may cause the 112 pump to generate a vacuum condition within the interior volume 103. The controller 114 may periodically cause the pump 112 to operate in order to maintain a selected pressure within the interior volume 103.

In one embodiment, the controller 114 controls a valve or other mechanism of the outflow channel 110 configured to selectively open or close the outflow channel 110. The controller 114 can open or close the outflow channel 110 in order to maintain or achieve selected pressure conditions within the interior volume 103. The controller 114 can open or close the outflow channel 110 in conjunction with operation of the pump 112 to maintain or achieve selected pressure conditions.

In one embodiment, the sensor 113 senses one or more physical parameters within the interior volume 103. The sensor 113 generates sensor signals indicative of the one or more parameters sensed by the sensor 113. The sensor 113 outputs the sensor signals.

In one embodiment, the sensor 113 is a pressure sensor. The pressure sensor is configured to sense the pressure within the interior volume 103 and to generate pressure signals indicative of the pressure in the interior volume 103. The pressure sensor outputs the pressure signals.

In one embodiment, the controller 114 receives the sensor signals from the sensor 113. The controller 114 can control the pump 112, the outflow channel 110, and the processing equipment 104 responses to the sensor signals. Accordingly, the controller 114 can control the operation of various components of the semiconductor processing system 100 based on the values of the sensor signals. If the sensor signals indicated a lower than desired pressure within the interior volume 103, then the controller 114 can cause the pump 112 to increase a pumping action. If the sensor signals indicate a higher than desired pressure within the interior volume 103, the controller 114 can cause the pump 112 to decrease a pumping action.

In some cases, the sensor 113 may generate a signal that results in a pressure alarm within the controller 114. During the pressure alarm, the pump 112 may cease to operate. Furthermore, during the pressure alarm the valve mechanism within the outflow channel 110 may cease to operate. As will be described in more detail below, this can result in large problems for the wafer 106.

Integrated circuits include many layers and structures made up of semiconductor material, dopant ions, dielectric materials, metal materials, and other types of material. The shapes, sizes, and compositions of these various structures of materials may need to fall within tight tolerances in order for the integrated circuits to operate correctly. Accordingly, if undesirable particles, gases, or materials come in contact with or otherwise interact with the wafer 106 during or between semiconductor processes, it is possible that the wafer 106 will be contaminated or that the shapes, sizes, or components of thin-film materials will become corrupted. If this happens, the integrated circuits that will be generated from the wafer 106 may not function properly, or may not function at all.

Accordingly, during an alarm situation in which the pump 112 is inoperable and the outflow channel 110 cannot be closed or opened, it is possible that particles or fluids may pass from the outflow channel 110 into the interior volume 103. For example, previously evacuated materials may reenter the outflow channel 110 and pass back into the interior volume 103. Alternatively, other contaminants from the exterior of the semiconductor chamber 102 may pass through the outflow chamber 110 into the interior volume 103. If this happens while the wafer 106 is present, then the particles or fluids may contaminate or otherwise corrupt the wafer 106.

In one embodiment, the semiconductor processing system 100 utilizes the nozzle array 111 to prevent or inhibit undesired particles, fluids, or materials from passing back into the interior volume 103 via the outflow channel 110 during a situation in which the pump 112 is inactive and the outflow channel 110 cannot be closed. In particular, the nozzle array 111 can implement a protective fluid barrier within the outflow channel 110. The protective fluid barrier inhibits or prevents particles, fluids, or other materials from passing into the interior volume 103 via the outflow channel 110.

In one embodiment, the nozzle array includes a plurality of nozzles. Each of the nozzles is configured to output a fluid into the outflow channel 110. The fluid from each of the nozzles of the nozzle array 111 collectively warms a fluid barrier. The fluid barrier prevents backflow of particles, fluid, or material into the interior volume 103. In other words, particles, fluid, or material from the exterior of the semiconductor process chamber 102 material flowing into the outflow channel 110 will be unable to pass through the fluid barrier formed by the collective fluid output of the nozzle array 111.

In one embodiment, the nozzle array 111 outputs a fluid that is unreactive with the wafer 106. For example, the nozzle array 111 can output an inert gas. In one embodiment, the fluid can include one or more of argon, nitrogen gas (N2), air, helium, or other types of gas or fluid selected to not be able to damage the wafer 106 and a portion of the fluid flows into the interior volume 103. Fluids other than those described above can be utilized by the nozzle array 111 without departing from the scope of the present disclosure.

In one embodiment, the nozzle array 111 outputs the fluid in a substantially horizontal direction across the outflow channel 110. In particular, the nozzle array 111 can include nozzles positioned around the interior circumference of the outflow channel 110. Each of the nozzles can be oriented to output fluid horizontally across the outflow channel 110. Said another way, each of the nozzles can be oriented to output fluid in a direction substantially perpendicular to vertical or substantially perpendicular to a direction of fluid flow through the outflow channel 110 during normal operation of the pump 112.

In one embodiment, the nozzle array 111 outputs of fluid in the rotational flow within the outflow channel 110. For example, each of the nozzles can be oriented to output fluid in a trajectory along the interior wall of the outflow channel 110. The nozzles can be positioned along the interior circumference of the outflow channel and oriented such that the fluid output from each nozzle results in a collective swirling or rotating flow within the outflow channel 110. The rotational motion of the fluid within the outflow channel 110 can be in a clockwise or counterclockwise direction when viewed from a top of the outflow channel 110. The rotational, swirling, or vortex motion of the fluid output by the nozzle array 111 forms a fluid barrier that prevents particles, other fluids, or material flowing back into the interior volume 103 through the fluid barrier.

In one embodiment, the nozzle array 111 outputs a rotational flow of fluid with a downward trajectory. Each of the nozzles of the nozzle array is pointed along the inner wall of the outflow channel 110 and slightly downward. The result is that the collective fluid flow rotates around the outflow channel 110 and progresses in a downward direction. This has the additional effect of pushing undesired articles, fluid, or material downward and out of the outflow channel 110.

In one embodiment, the nozzle array 111 includes a first group of nozzles that outputs fluid horizontally across the outflow chamber 110 as described above. The nozzle array 111 also includes a second group of nozzles that outputs fluid with the rotational motion as described above. The combination of horizontally directed nozzles and rotationally directed nozzles results in an effective fluid barrier that prevents undesirable particles, fluid, or material from passing through the fluid barrier into the interior volume 103. Other arrangements of nozzles and fluid output directions can be utilized to form a fluid barrier or to otherwise prevent backflow of undesirable particles, material, or fluid into the interior volume 103, without departing from the scope of the present disclosure.

Figure 2:
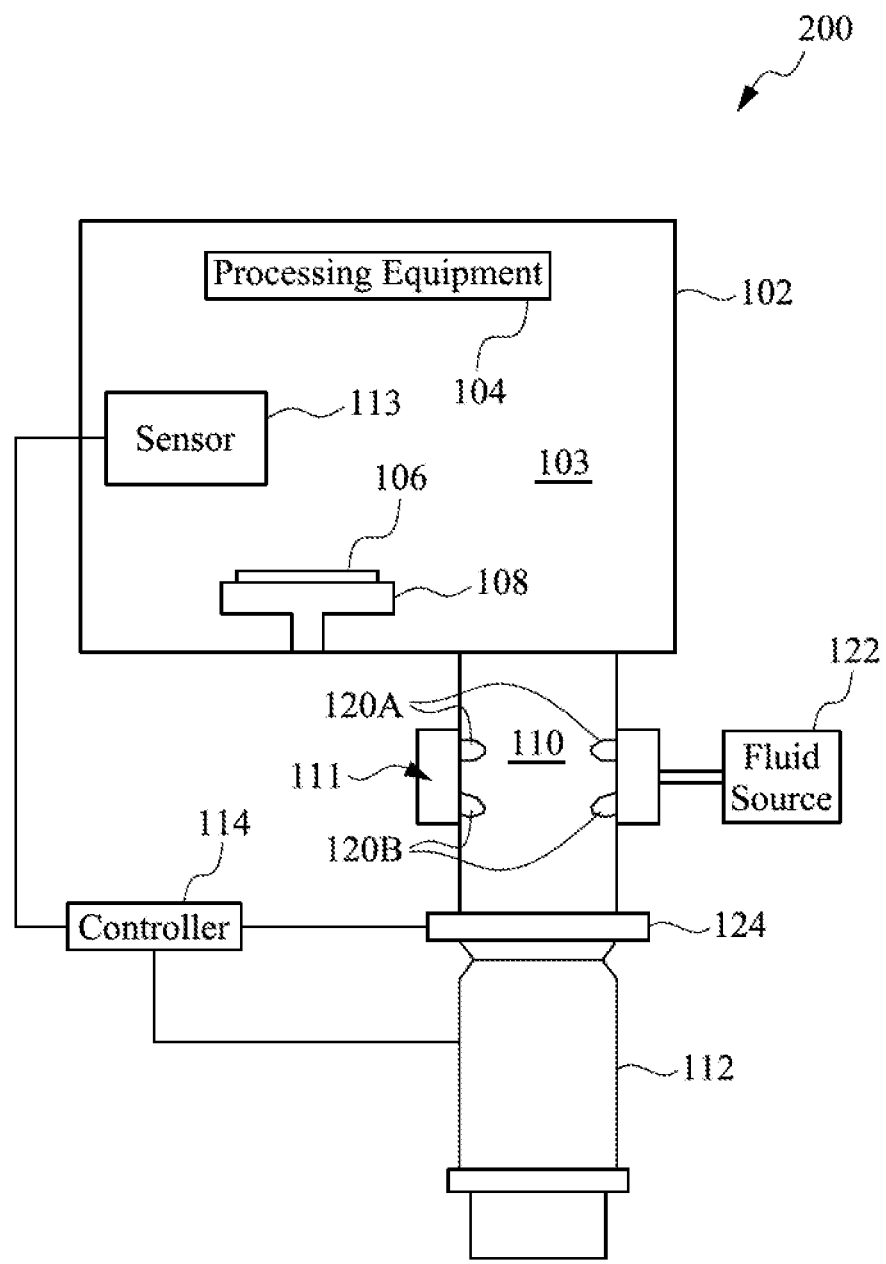
FIG. 2 is an illustration of a semiconductor process system, in accordance with some embodiments.

FIG. 2 is an illustration of a semiconductor process system 200, according to one embodiment. The semiconductor process system 100 includes a semiconductor process chamber 102, an outflow channel 110, a pump 112, and a controller 114. The semiconductor process chamber 102 has an interior volume 103. The semiconductor process chamber 102 includes processing equipment 104, a chuck 108, and a sensor 113. The chuck 108 is configured to hold or otherwise support a wafer 106 during semiconductor processing.

In one embodiment, the semiconductor process system 200 includes a valve 124 positioned in the outflow channel 110. The valve 124 is configured to selectively open or close the outflow channel 110 to enable fluid flow through the outflow channel 110. The valve 124 is coupled to the controller 114. The controller 114 can open or close the valve 124. In one embodiment, the controller 114 can partially open the valve to selectively constrict the flow of fluid through the outflow channel 110. The semiconductor process system 200 can include a mechanism other than the valve for selectively opening and closing the outflow channel 110.

As described previously, the pump 112 is configured to pump fluid from the interior volume 103 through the outflow channel 110 to an exterior of the combustion chamber 102. The pump 112 can establish and maintain a vacuum condition within the interior volume 103. The pump 112 can establish and maintain other pressure conditions within the interior volume 103.

As described previously, an alarm condition or fault condition indicated by the sensor 113 can cause the controller 114 to disable the pump 112 and to maintain the valve 124 in an open condition. In this case, the controller 114 can control the nozzle array 111 to generate fluid barrier within the outflow channel 110. The fluid barrier prevents backflow of particles, fluid, or material through the outflow channel 110 into the interior volume 103. In one embodiment, the same signal that disables the pump 112 can enable the nozzle array 111.

The nozzle array 111 is positioned at least partially within the outflow channel 110. The nozzle array 111 includes a group of first fluid nozzles 120A and a group of second fluid nozzles 120B. A fluid source 122 supplies fluid to the fluid nozzles 120A, 120B. The nozzle array 111 is configured to generate a fluid barrier within the outflow channel 110 by outputting fluid into the outflow channel in a selective manner.

The source 122 can supply a fluid that is unreactive with the semiconductor wafer 106. The fluid source 122 can supply an inert gas. The inert gas can include argon, N2, helium, or another inert gas. The fluid can include air.

In one embodiment, the first fluid nozzles 120A output the fluid in a substantially horizontal direction across the outflow channel 110. In particular, the first fluid nozzles 120A are positioned around the interior circumference of the outflow channel 110. Each of the first nozzles 120A can be oriented to output fluid horizontally across the outflow channel 110. Accordingly, each of the first nozzles 120A can be oriented to output fluid in a direction substantially perpendicular to vertical or substantially perpendicular to a direction of fluid flow through the outflow channel 110 during normal operation of the pump 112.

In one embodiment, the second fluid nozzles 120B output fluid with a rotational flow within the outflow channel 110. For example, each of the second nozzles 120B can be oriented to output fluid in a trajectory along the interior wall of the outflow channel 110. The second nozzles 120B can be positioned along the interior circumference of the outflow channel and oriented such that the fluid output from the second nozzle 120B results in a collective swirling or rotating flow of fluid within the outflow channel 110. The rotational motion of the fluid within the outflow channel 110 can be in a clockwise or counterclockwise direction when viewed from a top of the outflow channel 110. The rotational, swirling, or vortex motion of the fluid output by the nozzle array 111 forms a fluid barrier that prevents particles, other fluids, or material flowing back into the interior volume 103 through the fluid barrier.

In one embodiment, the second fluid nozzles 120B output a rotational flow of fluid with a downward trajectory. Each of the second fluid nozzles 120B is pointed along the inner wall of the outflow channel 110 and slightly downward. The result is that the collective fluid flow rotates around the outflow channel 110 and progresses in a downward direction while rotating around the outflow channel 110. This has the additional effect of pushing undesired articles, fluid, or material downward out of the outflow channel 110.

In one embodiment, the nozzle array 111 includes a first group of nozzles that outputs fluid horizontally across the outflow chamber 110 as described above. The nozzle array 111 also includes a second group of nozzles that outputs fluid with the rotational motion as described above. The combination of horizontally firing nozzles and rotationally firing nozzles results in an effective fluid barrier that prevents undesirable particles, fluid, or material from passing through the fluid barrier into the interior volume 103. Other arrangements of nozzles and fluid output directions can be utilized to form a fluid barrier or to otherwise prevent backflow of undesirable particles, material, or fluid into the interior volume 103, without departing from the scope of the present disclosure.

Figure 3A:
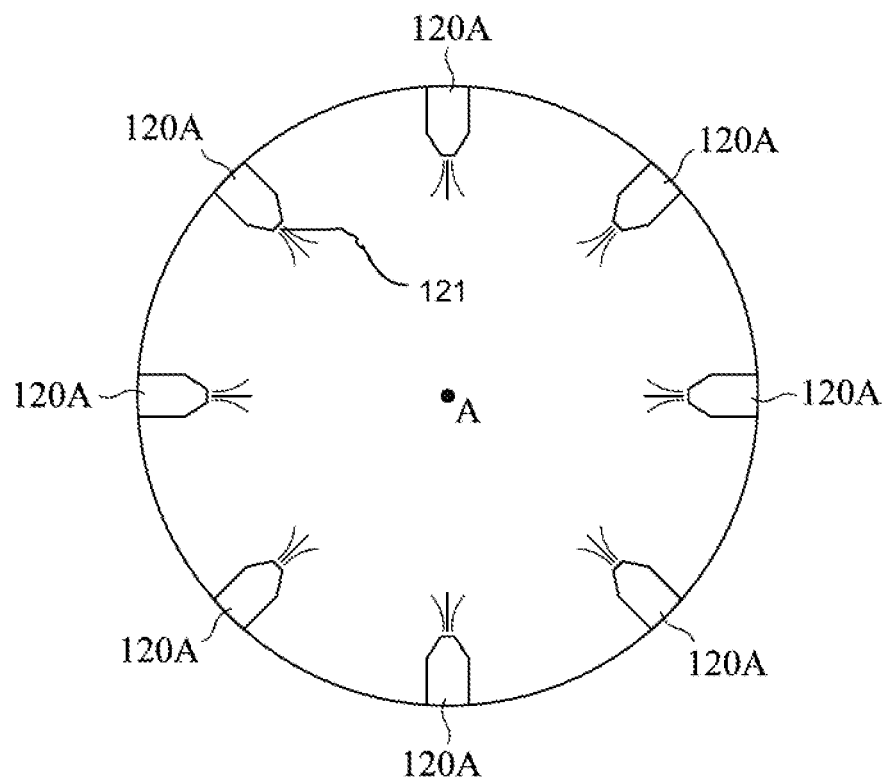
FIG. 3A is a top view of first fluid nozzles in an outlet channel of a semiconductor process chamber, according to one embodiment.

FIG. 3A is a top view of first fluid nozzles 120A of a nozzle array 111 within an outlet channel 110 of a semiconductor process chamber 102, according to one embodiment. The first fluid nozzles 120A are arranged around an interior circumference of the outlet channel 110. Each of the first fluid nozzles 120A is oriented to output fluid substantially horizontally across the outlet channel 110. In the example of FIG. 3A, eight first fluid nozzles 120A are present in the channel 110. However, the nozzle array 111 can include more first fluid nozzles or fewer first fluid nozzles than eight without departing from the scope of the present disclosure. Furthermore, the first fluid nozzles 120A can be arranged differently than shown in FIG. 3A without departing from the scope of the present disclosure. Though not shown in FIG. 3A, portions of the first fluid nozzles 120A may be positioned outside the outlet channel 110. Accordingly, portions of the first fluid nozzles 120A may be positioned within the outlet channel 110 while other portions of the first fluid nozzles 120A may be positioned outside the outlet channel 110.

The first fluid nozzles 120A have orifices 121. Fluid is output from the first fluid nozzles 120A via the orifices 121. In one embodiment, the orifices 121 each have a diameter between 2 mm and 10 mm. The orifices 121 can have diameters other than those described above without departing from the scope of the present disclosure. The diameters of the orifices 121 can be selected, in part, based on the desired flow rate of fluid from the fluid nozzles 120A.

In one embodiment, the first fluid nozzles 120A oriented such that the orifices 121 output fluid toward a central access A of the outlet channel 110. The central axis A extends vertically through a center of the outlet channel 110. The orientation of the first fluid nozzles 120 can collectively result in a fluid barrier that inhibits undesired fluids or particles from entering into the semiconductor process chamber 102 via the outlet channel 110. Other orientations of the first fluid nozzles 120 a can be utilized without departing from the scope of the present disclosure.

The controller 114 can activate the first fluid nozzles 120A. When activated, the first fluid nozzles 120A each output fluid horizontally across the outlet channel 110. The first fluid nozzles 120A generate a fluid barrier via the output of fluid from each of the first fluid nozzles 120A. The fluid barrier effectively prevents particles, fluid, or other material from reentering the interior volume 103 of the semiconductor process chamber 102 via the outlet channel 110.

Figure 3B:
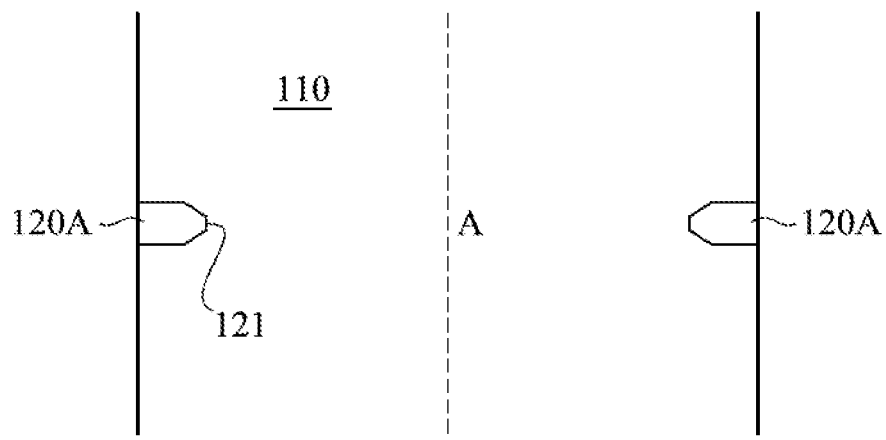
FIG. 3B is a side sectional view of first fluid nozzles in the outlet channel of FIG. 3A, according to one embodiment.

FIG. 3B is a side view of first fluid nozzles 120A of FIG. 3A state, according to one embodiment. In FIG. 3B, the controller 114 has activated the first fluid nozzles 120A. The view of FIG. 3B demonstrates the substantially horizontal output of fluid from the first fluid nozzles 120A. As used herein, the horizontal output of fluid corresponds to outputting in fluid primarily in the horizontal direction though some of the fluid may go somewhat upward or downward.

Figure 4A:
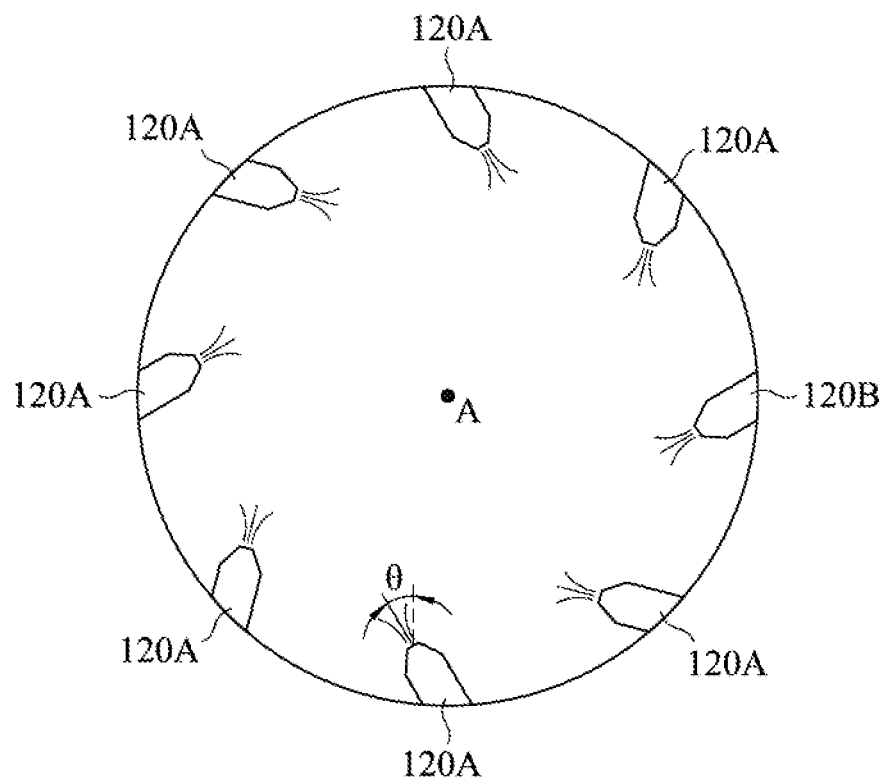
FIG. 4A is a top view of second fluid nozzles in an outlet channel of a semiconductor process chamber, according to one embodiment.

FIG. 4A is a top view of second fluid nozzles 120B of a nozzle array 111 within an outlet channel 110 of a semiconductor process chamber 102, according to one embodiment. The second fluid nozzles 120B are arranged around an interior circumference of the outlet channel 110. Each of the second fluid nozzles 120B is oriented to output fluid along an interior wall of the outlet channel 110 in a manner selected to generate a rotating, swirling, or vortex flow of the fluid within the outlet channel 110. Though not apparent in FIG. 4A, the second fluid nozzles 120B may also be oriented downward in order to generate a rotation flow of fluid moving in the downward direction through the outlet channel 110. In the example of FIG. 4A, six second fluid nozzles 120B are present in the outlet channel 110. However, the nozzle array 111 can include more second fluid nozzles or fewer second fluid nozzles than six without departing from the scope of the present disclosure. Furthermore, the second fluid nozzles 120B can be arranged and oriented differently than shown in FIG. 4A without departing from the scope of the present disclosure.

The second fluid nozzles 120B are each oriented at an angle θ relative to a line pointing to the central axis or A of the outlet channel 110. The central axis A extends vertically through a center of the outlet channel 110. The angle θ of the fluid nozzles 120B is selected to ensure that fluid released from the fluid nozzles 120B travels with a rotating motion along the along the interior wall of the outlet channel 110. The angle θ is an angle in the horizontal plane indicating a rotation of the orifice 121 in the horizontal plane away from a line pointing from the orifice 121 to the central axis A. In one embodiment, the angle θ is between 25° and 35°. Other values of the angle θ can be utilized without departing from the scope of the present disclosure. While the angle θ is illustrated for only one of the second fuel nozzles 120B, each of the fuel nozzles 120B makes the same angle θ with respect to the orientation of its orifice 121 relative to the central axis A. In alternative embodiments, the second fuel nozzles 120B can have the values of θ different from each other.

Figure 4B:
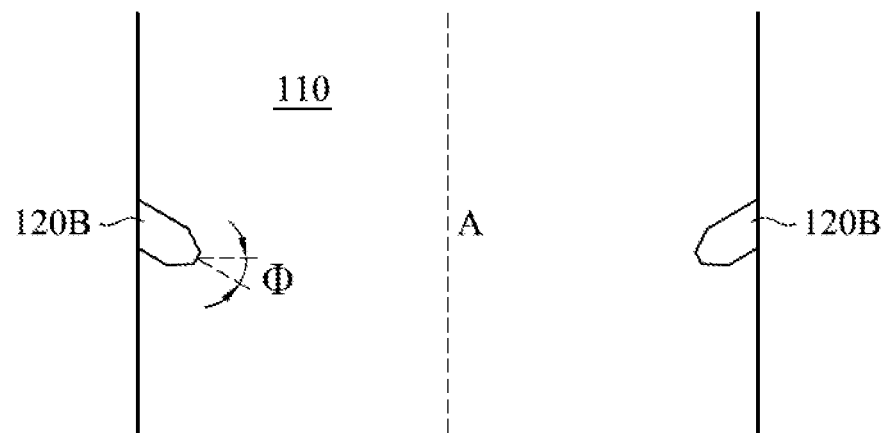
FIG. 4B is a side sectional view of first fluid nozzles in the outlet channel of FIG. 4A, according to one embodiment.

The controller 114 can activate the second fluid nozzles 120B. The second fluid nozzles 120B each output fluid with an orientation selected to generate a rotating, swirling, or vortex flow of fluid within the outlet channel 110. The second fluid nozzles 120B generate a fluid barrier via the output of fluid from each of the second fluid nozzles 120B. The fluid barrier effectively prevents particles, fluid, or other material from reentering the interior volume 103 of the semiconductor process chamber 102 via the outlet channel 110. In the example of FIG. 4B, the fluid rotates in a clockwise direction from a top view. However, the second fluid nozzles can be oriented to generate a flow of field in a counterclockwise direction without departing from the scope of the present disclosure.

FIG. 4B is a side sectional view of the outlet channel 110 including second fluid nozzles 120B of FIG. 4A, according to one embodiment. FIG. 4B illustrates that the second fluid nozzles 120B or oriented downward relative to horizontal. The downward orientation of the second fluid nozzles 120B ensures that the fluid moves in a downward direction while rotating around the outlet channel 110.

The second fluid nozzles 120B are each oriented downward at an angle φ relative to horizontal or relative to the X-Y plane. The central axis A extends vertically through a center of the outlet channel 110. The angle φ of the fluid nozzles 120B is selected to ensure that fluid released from the fluid nozzles 120B travels downward while rotating. In one embodiment, the angle φ is between 20° and 30°. The value of the value of the angle φ is selected to ensure a gradual downward flow of the rotating fluid. Other values of the angle φ can be utilized without departing from the scope of the present disclosure. While the angle φ is illustrated for only one of the second fuel nozzles 120B, each of the fuel nozzles 120B makes the same angle φ with respect to the orientation of its orifice 121 relative to horizontal. In alternative embodiments, the second fuel nozzles 120B can have values of φ different from each other.

In one embodiment, the controller 114 can operate both the first fluid nozzles 120A and the second fluid nozzles 120B simultaneously. Accordingly, the fluid barrier is made up of the horizontally output fluid from the first fluid nozzles 120A and the rotating fluid output from the second fluid nozzles 120B. Additionally, or alternatively, the controller 114 can selectively operate either the first fluid nozzles 120A or the second fluid nozzles 120B. In one embodiment, controller 114 can selectively operate individual first fluid nozzles 120A or second fluid nozzles 120B.

Figure 5:
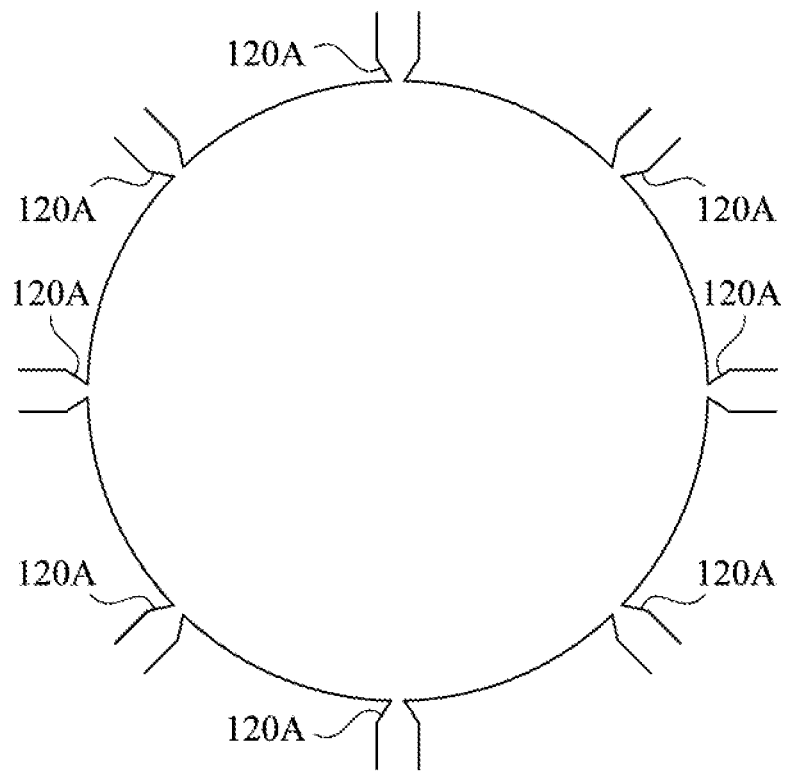
FIG. 5 is an illustration of an arrangement of fluid nozzles with respect to an outlet channel of a semiconductor process chamber, according to one embodiment.

FIG. 5 is a top view of first fluid nozzles 120A positions to output fluid into an outlet channel 110, according to one embodiment. In the view of FIG. 5, the first fluid nozzles 120A are positioned entirely outside the outlet channel 110. The outlet channel 110 can include apertures through which the first fluid nozzles 120A can output fluid into the interior of the outlet channel 110. The output ends of first fluid nozzles 120A can be positioned to entirely cover the apertures in the outlet channel 110. Though not shown in the figures, the second fluid nozzles 120B can also be positioned entirely external to the outlet channel 110.

Figure 6:
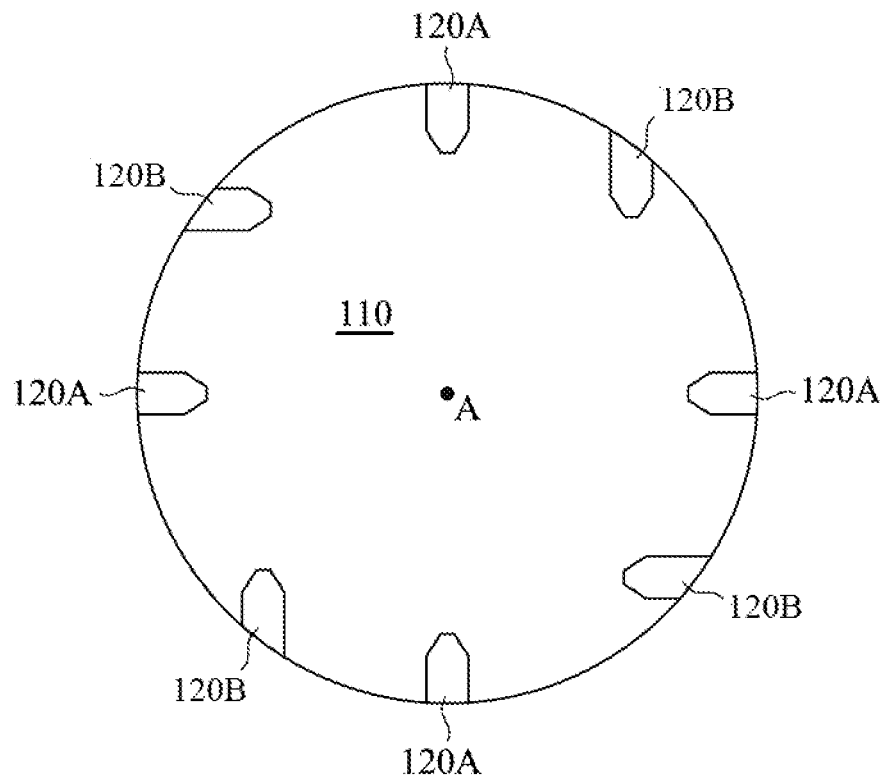
FIG. 6 is a top view of first and second fluid nozzles in an outlet channel of a semiconductor process chamber, according to one embodiment.

FIG. 6 is a top view of the outlet channel 110, according to one embodiment. In FIG. 6, the first fluid nozzles 120A and second fluid nozzles 120B are positioned in a same horizontal plane. The first fluid nozzles 120A are oriented to output fluid horizontally toward the central axis A of the outlet channel 110. The second fluid nozzles 120B are oriented to output fluid with horizontal and vertical angles θ and φ (see FIGS. 4A and 4B) as described in relation to FIGS. 4A and 4B. There can be more or fewer of the first and second fuel nozzles 120A and 120B that are shown in FIG. 6 without departing from the scope of the present disclosure.

Figure 7:
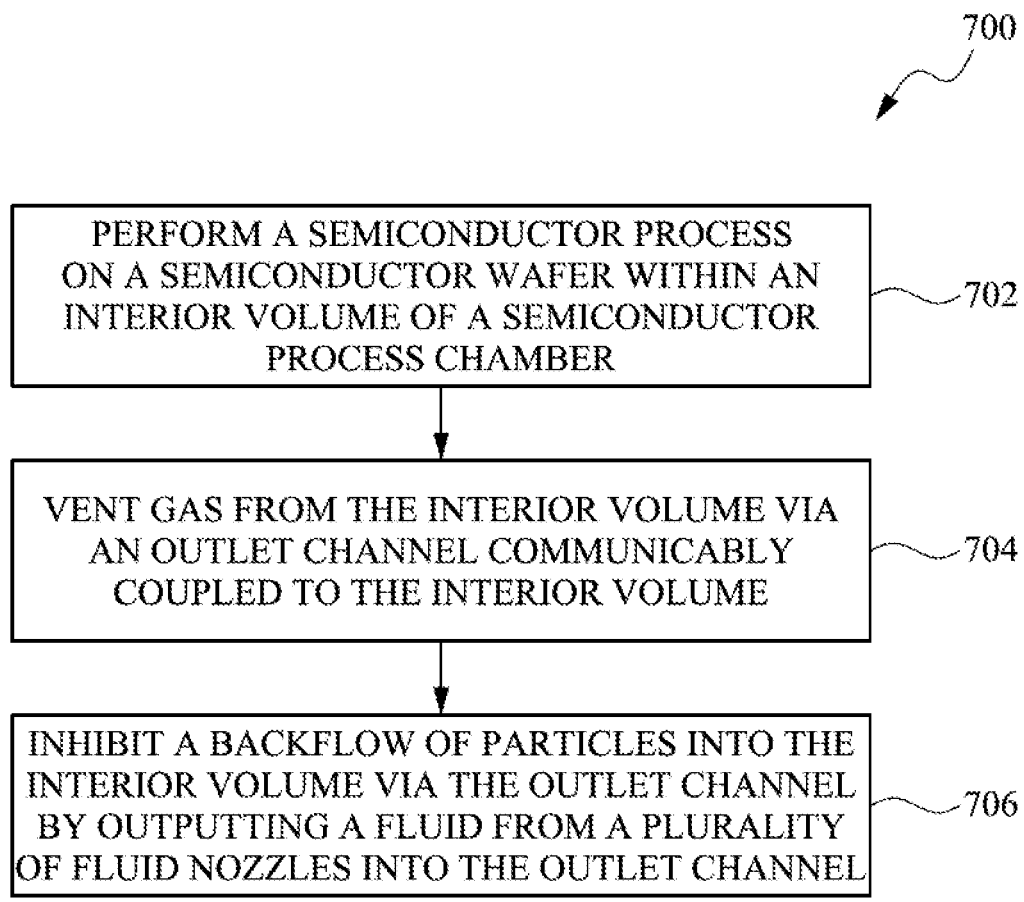
FIG. 7 is flow diagram of a semiconductor process method, according to one embodiment.

FIG. 7 is a flow diagram of a semiconductor process method 700, according to one embodiment. At 702, the method 700 includes performing a semiconductor process on a semiconductor wafer within an interior volume of a semiconductor process chamber. One example of a semiconductor wafer is the wafer 106 of FIG. 1. One example of a semiconductor process chamber is the semiconductor process chamber 102 of FIG. 1. One example of an interior volume is the interior volume of FIG. 1. At 704, the method 700 includes venting gas from the interior volume via an outlet channel communicably coupled to the interior volume. One example of an outlet channel 110 is the outlet channel 110 of FIG. 1. At 706 the method 700 includes inhibiting a backflow of particles into the interior volume via the outlet channel by outputting a fluid from a plurality of fluid nozzles into the outlet channel. One example of fluid nozzles is the fluid nozzles 120A and 120B of FIG. 2.

One embodiment is a semiconductor process system, including a semiconductor process chamber including an interior volume, a chuck positioned within the interior volume and configured to hold a semiconductor wafer, and semiconductor processing equipment configured to perform one or more semiconductor processes on the semiconductor wafer within the interior volume. The system includes an outlet channel configured to convey gases from the interior volume to an exterior of the semiconductor process chamber and a plurality of fluid nozzles configured to output a fluid into the outlet channel.

In one embodiment, a semiconductor process method includes performing a semiconductor process on a semiconductor wafer within an interior volume of a semiconductor process chamber and venting gas from the interior volume via an outlet channel communicably coupled to the interior volume. The method includes inhibiting a backflow of particles into the interior volume via the outlet channel by outputting a fluid from a plurality of fluid nozzles into the outlet channel.

In one embodiment, a semiconductor process system includes a semiconductor process chamber including an interior volume, a chuck positioned within the interior volume and configured to hold a semiconductor wafer, and an outlet channel configured to convey gases from the interior volume to an exterior of the semiconductor process chamber. The system includes a plurality of fluid nozzles arranged to inhibit a backflow of particles into the interior volume from the outlet channel by outputting a fluid within or adjacent to the outlet channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor process system, comprising:
a semiconductor process chamber including an interior volume;
a chuck positioned within the interior volume and configured to hold a semiconductor wafer;
semiconductor processing equipment configured to perform one or more semiconductor processes on the semiconductor wafer within the interior volume;
an outlet channel configured to convey gases from the interior volume to an exterior of the semiconductor process chamber; and
a plurality of fluid nozzles configured to output a fluid into the outlet channel, the plurality of fluid nozzles including a first group of fluid nozzles at a first vertical level within the outlet channel and a second group of fluid nozzles at a second vertical level below the first vertical level within the outlet channel, wherein the first group of fluid nozzles is aimed with a greater vertical orientation than the second group of fluid nozzles.

2. The system of claim 1, wherein the plurality of fluid nozzles are configured to inhibit a backflow of particles into the interior volume from the outlet channel by outputting the fluid into the outlet channel.

3. The system of claim 2, wherein one or more of the fluid nozzles are positioned at least partially within the outlet channel.

4. The system of claim 1, further comprising a controller communicably coupled to the fluid nozzles and configured to selectively activate the fluid nozzles.

5. The system of claim 4, further comprising a pump configured to pump gases from the interior volume via the outlet channel.

6. The system of claim 5, wherein the controller is configured to activate the fluid nozzles responsive to a fault condition in the pump.

7. The system of claim 6, further comprising a sensor coupled to the controller and configured to provide sensor signals to the controller indicative of one or more parameters within the interior volume, wherein the controller is configured to activate the fluid nozzles responsive to the sensor signals.

8. The system of claim 1, wherein the fluid nozzles are arranged around a circumference of the outlet channel.

9. The system of claim 8, wherein the fluid nozzles are each configured to output the fluid substantially perpendicular to a primary flow direction of the outlet channel.

10. The system of claim 1, wherein the fluid nozzles are arranged to generate a rotating flow of the fluid within the outlet channel.

11. A method, comprising:
performing a semiconductor process on a semiconductor wafer within an interior volume of a semiconductor process chamber;
venting gas from the interior volume via an outlet channel communicably coupled to the interior volume; and
inhibiting a backflow of particles into the interior volume via the outlet channel by outputting a fluid from a plurality of fluid nozzles into the outlet channel, the plurality of fluid nozzles including a first group of fluid nozzles at a first vertical level within the outlet channel and a second group of fluid nozzles at a second vertical level below the first vertical level within the outlet channel, wherein the first group of fluid nozzles is aimed with a greater vertical orientation than the second group of fluid nozzles.

12. The method of claim 11, further comprising:
venting gas from the interior volume by pumping gas from the interior volume via the outlet channel with a pump;
ceasing operation of the pump; and
activating the fluid nozzles responsive to or in tandem with shutting off the pump.

13. The method of claim 12, further comprising:
generating sensor signals indicative of a condition within the interior volume;
ceasing operation of the pump responsive to the sensor signals; and
activating the fluid nozzles responsive to the sensor signals.

14. The method of claim 11, wherein outputting the fluid includes generating a fluid barrier within the outlet channel.

15. The method of claim 11, wherein outputting the fluid includes:
outputting horizontal streams of fluid from a first group of the fluid nozzles; and
generating a rotating flow of fluid within the outlet channel with a second group of the fluid nozzles.

16. The method of claim 11, wherein the fluid includes an inert gas.

17. The method of claim 11, wherein the fluid includes air.

18. A method, comprising:
performing a semiconductor process on a semiconductor wafer within an interior volume of a semiconductor process chamber;
venting gas from the interior volume via an outlet channel communicably coupled to the interior volume;
inhibiting a backflow of particles into the interior volume via the outlet channel by outputting a fluid from a plurality of fluid nozzles into the outlet channel responsive to detecting a fault in a pump coupled to the outlet channel.

19. The method claim 18, wherein the plurality of fluid nozzles includes:
a first group of fluid nozzles oriented to output the fluid in a direction substantially horizontal to a primary direction of gas flow in the outlet channel; and
a second group of fluid nozzles oriented to generate a rotating flow of the fluid.

20. The method 19, wherein the second group of fluid nozzles is positioned below the first group of fluid nozzles.

* * * * *